(12) United States Patent
Rapisarda et al.

(10) Patent No.: US 7,791,426 B2
(45) Date of Patent: Sep. 7, 2010

(54) FREQUENCY MODULATOR

(75) Inventors: Andrea Rapisarda, Motta S. Anastasia (IT); Filippo Marino, Tremestieri Etneo (IT); Angelo Maria D'Arrigo, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 262 days.

(21) Appl. No.: 12/117,328

(22) Filed: May 8, 2008

(65) Prior Publication Data

US 2008/0278254 A1    Nov. 13, 2008

(30) Foreign Application Priority Data

May 8, 2007   (IT)   .......................... MI2007A0931

(51) Int. Cl.
*H03B 23/00* (2006.01)
*H03K 4/02* (2006.01)
*H03K 4/06* (2006.01)

(52) U.S. Cl. .................. 331/178; 327/126; 327/131
(58) Field of Classification Search ............. 331/177 R, 331/178; 332/117, 118; 327/126–128, 131–140
See application file for complete search history.

(56) References Cited

U.S. PATENT DOCUMENTS 4,654,604 A * 3/1987 Smith et al. ................. 331/1 A
4,695,931 A * 9/1987 Yamaura et al. ............... 363/8

* cited by examiner

*Primary Examiner*—David Mis
(74) *Attorney, Agent, or Firm*—Lisa K. Jorgenson; E. Russell Tarleton; Seed IP Law Group PLLC

(57) ABSTRACT

A clock frequency modulator for an oscillator having a digital circuit for the generation of a signal modulating the clock frequency, the digital circuit adapted to obtain, from the signal generated by the oscillator, a first pulse signal having a lower frequency than the clock frequency of the oscillator, a digital counter adapted to count the pulses of the first signal and to produce a digital signal and a digital-to-analog converter adapted to convert the digital signal in the signal for modulating the clock frequency of the oscillator.

18 Claims, 3 Drawing Sheets

FREQUENCY MODULATOR

BACKGROUND

1. Technical Field

The present disclosure relates to a frequency modulator, and more specifically to a clock frequency modulator.

2. Description of the Related Art

Devices adapted to modulate a clock frequency are known. A typical application for frequency modulators are switching regulators. A serious problem for switching regulators are the electromagnetic interferences (EMI) generated especially because of their fast switching features.

One approach to reducing electromagnetic interferences consists in the periodic or random modulation of a parameter of the signals which are applied to switching devices, such as the switching frequency. The parameter oscillates with small amplitudes around a nominal value so that the power of the harmonics is distributed on the spectrum. In order to reduce the emissions of electromagnetic interferences of the regulator and reduce the cost and size of the line filters, the switching frequency thereof needs to be modulated so that the resulting action on the distribution spectrum allows the distribution of the energy of each harmonic of the switching frequency on a number of sideband harmonics that have the same energy though a smaller amplitude.

A typical frequency modulator circuit adapted to generate a low-frequency triangular waveform is shown in FIG. 1. The circuit includes a capacitor C which is connected to ground GND and to a current generator Ic connected to a supply voltage Vdd and to a switch S that may be connected to another current generator Icc that is connected to ground GND. The capacitor is also connected to the non-inverting terminal of a hysteresis comparator Comp having the inverting terminal connected to a reference voltage Vref. The output voltage of the comparator Comp controls the closing or opening of the switch S for the generation of a triangular wave on the non-inverting terminal of the comparator Comp. In order to modulate the frequency, the circuit topologies generally use the triangular waveform generated in this way as a modulating reference voltage to control the oscillation frequency of the main oscillator.

In a completely integrated clock frequency modulator a low-frequency triangular wave needs to be generated without using external components. The triangular waveform is the modulating reference voltage that may be used to vary a circuit parameter of the oscillator so that the frequency of the oscillator is modulated by the modulating signal.

In view of the state of the art, a clock frequency modulator that is simpler than the known frequency modulators and that may be integrated needs to be provided.

BRIEF SUMMARY

According to the present disclosure a clock frequency modulator for an oscillator may be provided, and which includes a digital circuit or circuit means for the generation of a signal for modulating said clock frequency, said digital means including a first circuit or circuit means adapted to obtain from the signal generated by the oscillator a first pulse signal having a lower frequency than the clock frequency of the oscillator, a digital counter adapted to count the pulses of said first signal and to produce a digital signal and a digital-to-analog converter adapted to convert the digital signal in said signal for modulating the clock frequency of the oscillator.

In accordance with one embodiment of the present disclosure, a modulation method for a clock frequency of an oscillator is provided, the method including generating a signal for modulating said clock frequency, said generation step including the step of obtaining a first pulse signal having a lower frequency than the clock frequency of the oscillator from the signal generated by the oscillator, digital counting of the pulses of said first signal, producing of a digital signal and the digital to analog conversion of the digital signal in said signal for modulating the clock frequency of the oscillator.

In accordance with another embodiment of the present disclosure, a modulator for an oscillator is provided, the modulator including a waveform generator comprising first and second frequency dividers adapted to receive a clock signal from the oscillator and divide the clock signal by predetermined values that are different one from the other; a counter receiving output signals from the first and second frequency dividers and generating an output; and a digital-to-analog converter receiving as input the output signal from the counter and further receiving at least one input reference voltage signal and generating in response thereto a triangular waveform signal for output to the oscillator.

In accordance with another embodiment of the present disclosure, a system is provided, including an oscillator generating an output signal in the form of a clock signal; and a modulator, the modulator including a waveform generator having first and second frequency dividers adapted to receive a clock signal from the oscillator and divide the clock signal by predetermined values that are different one from the other; a counter receiving output signals from the first and second frequency dividers and generating an output; and a digital-to-analog converter receiving as input the output signal from the counter and further receiving at least one input reference voltage signal and generating in response thereto a triangular waveform signal for output to the oscillator.

BRIEF DESCRIPTION OF THE SEVERAL VIEWS OF THE DRAWING(S)

The features of the present disclosure will become apparent from the following detailed description of an embodiment thereof, shown by way of non-limiting example in the accompanying drawings, in which.

DETAILED DESCRIPTION

Figure 1:
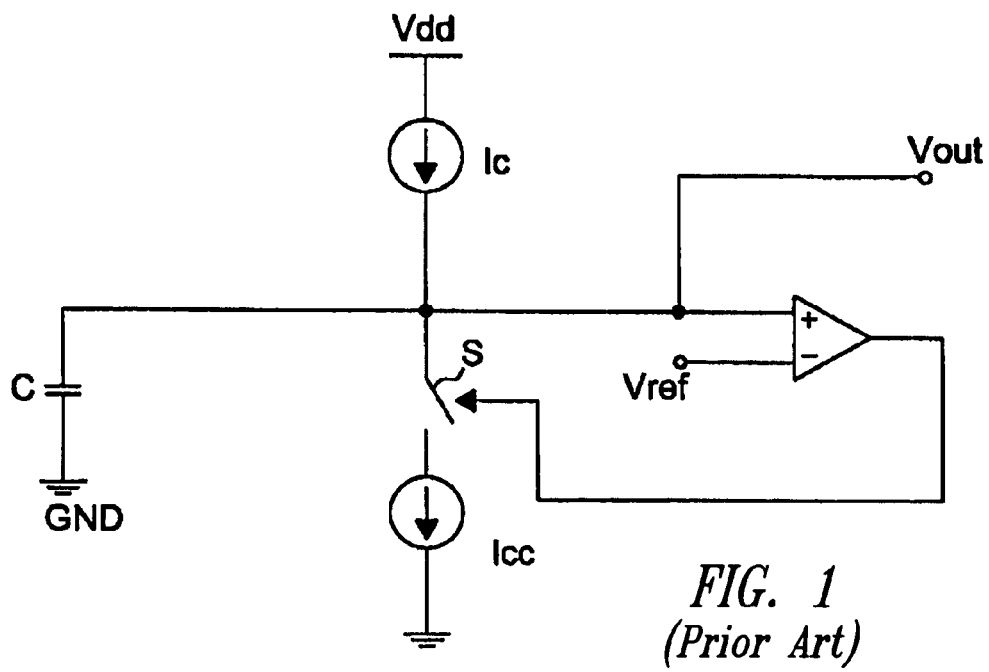
FIG. 1 is a diagram of a clock frequency modulator according to the known art.
Figure 2:
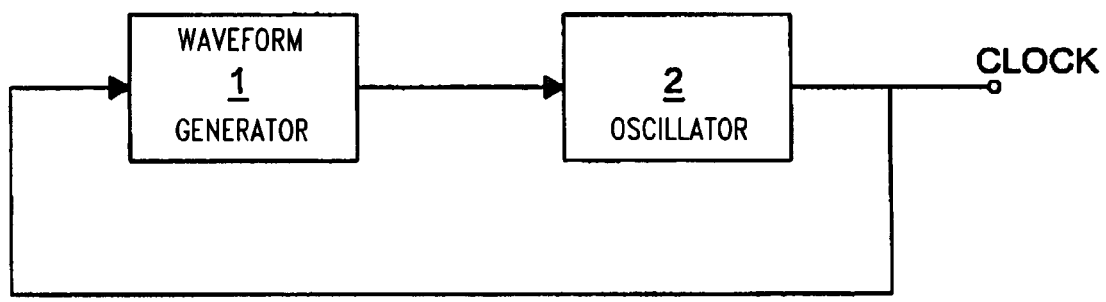
FIG. 2 is a diagram of a clock frequency modulator according to an embodiment of the present disclosure.

FIG. 2 shows a diagram of a frequency modulator according to the present disclosure. The diagram includes a digital-type triangular waveform generator 1, the output signal of which modulates an oscillator 2 adapted to provide the clock signal CLOCK.

Figure 3:
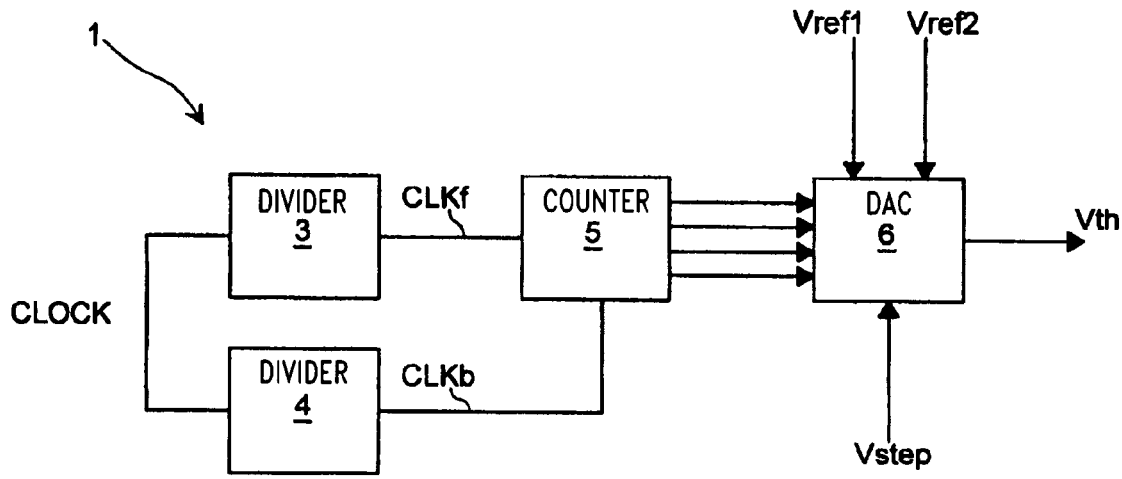
FIG. 3 shows a part of the modulator in FIG. 2 in detail.
Figure 4:
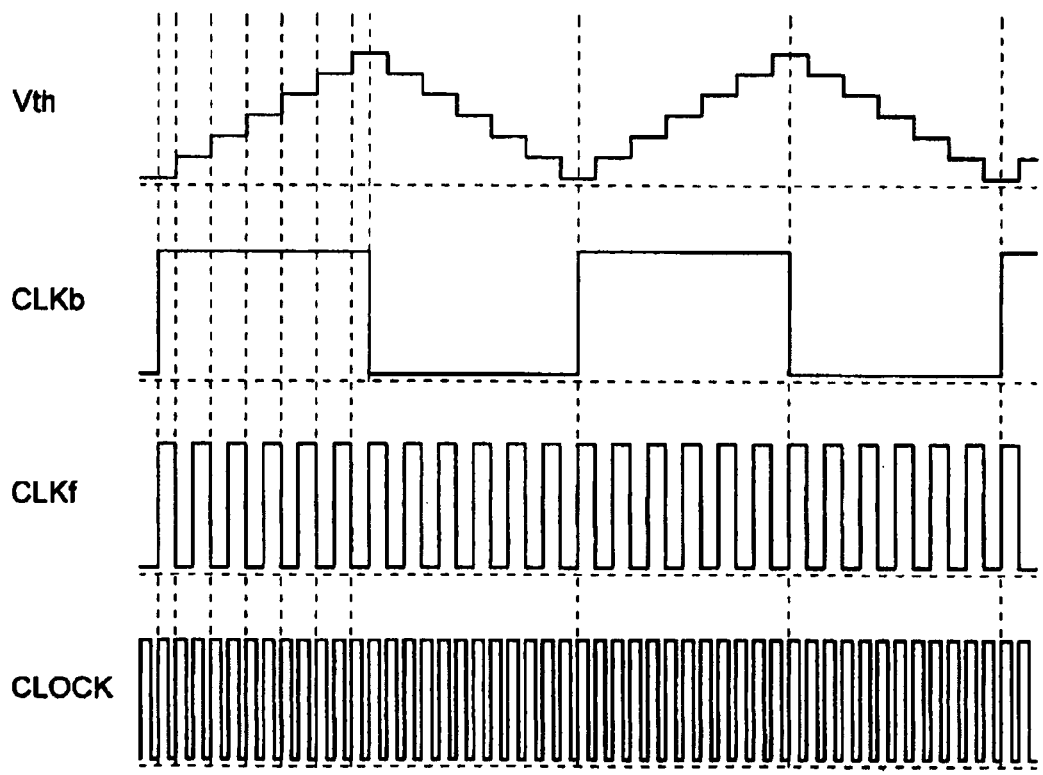
FIG. 4 shows the time diagrams of signals involved in the modulator in FIG. 2.

The triangular waveform generator 1 is shown in greater detail in FIG. 3. Said generator includes a first 3 and a second 4 frequency divider adapted to divide the frequency of the CLOCK signal by predetermined values which are different one from the other, a counter 5 supplied by the signals from the dividers 3 and 4 and a digital-to-analog converter (DAC)

6 having as an input the output signal from the counter 5 and adapted to generate the triangular waveform signal Vth.

Two signals are generated from the clock signal CLOCK; a high frequency signal CLKf generated by the divider 3 and a low frequency signal CLKb generated by the divider 4. The digital counter 5 is preferably an N-bit counter capable of increasingly and decreasingly counting. The signal CLKb, which has at least two logical levels, controls the counter 5 so that it increasingly or decreasingly counts while the signal CLKf is the counted signal; said signal is a pulse signal, which pulses are counted by the counter 5. The signal CLKb is generally a square wave signal and the counter 5 increasingly or decreasingly counts the pulses of the signal CLKf until the state of the signal CLKb changes; the counted digital word is issued in real time as an input to the DAC 6, which provides an output voltage value. The waveform of the modulating reference voltage signal Vth produced by the DAC 6 will be a triangular form.

The DAC has an input reference voltage signal Vstep and operates so that at each increase or decrease of the digital word counted by the counter 5 an increase or decrease of the voltage value Vstep of the voltage signal Vth is obtained; in this way the voltage signal Vth gains the waveform of a triangular wave signal of the type including voltage-stepped ramps, each having the reference voltage value Vstep.

If Tb and Tf indicate the times associated with the frequencies of the signals CLKb and CLKf, the result is:

$$\frac{Tb}{2} = (Q-1) \times Tf$$

where Q indicates the number of quantization levels; Tb=Nb/Fclock and Tf=Nf/Fclock is therefore obtained where Fclock indicates the frequency of the clock signal CLOCK and Nb and Nf are the ratios of the frequency dividers 4 and 3.

$$\frac{Nb}{Nf} = 2(Q-1)$$

is therefore obtained.

The value of Q depends on the precision of the desired DAC and on the occupied area in the integrated circuit of the dividers 3 and 4. The same DAC 6 may have two input reference signals Vref1 and Vref2 instead of the voltage value Vstep, which reference signals Vref1 and Vref2 are adapted to respectively establish the minimum level and the maximum level of the modulating signal; the voltage value of the single step of the triangular waveform Vth of the stepped ramp type is obtained from the division of the difference between Vref2 and Vref1 and the value (Q-1).

In a specific application, the clock signal CLOCK is a 120 kHz square wave and is processed through the dividers 3 and 4 with Nb=504 and Nf=4 thus obtaining Q=64. The DAC 6 is a six-bit converter and produces a stepped triangular waveform by means of a voltage divider connected between two voltage reference values, a minimum voltage reference and a maximum voltage reference.

The mean value of the triangular wave 1, 15 V, is the voltage reference ensuring the fundamental frequency, whereas the amplitude value of about 80 mV determines the modulation depth of the clock frequency. The frequency of the triangular waveform is the lowest of the frequencies of the signal CLKb and it determines the modulating frequency. When Fclock=120 kHz and Nb=504, the modulating frequency is Fm=238 Hz.

Figure 5:
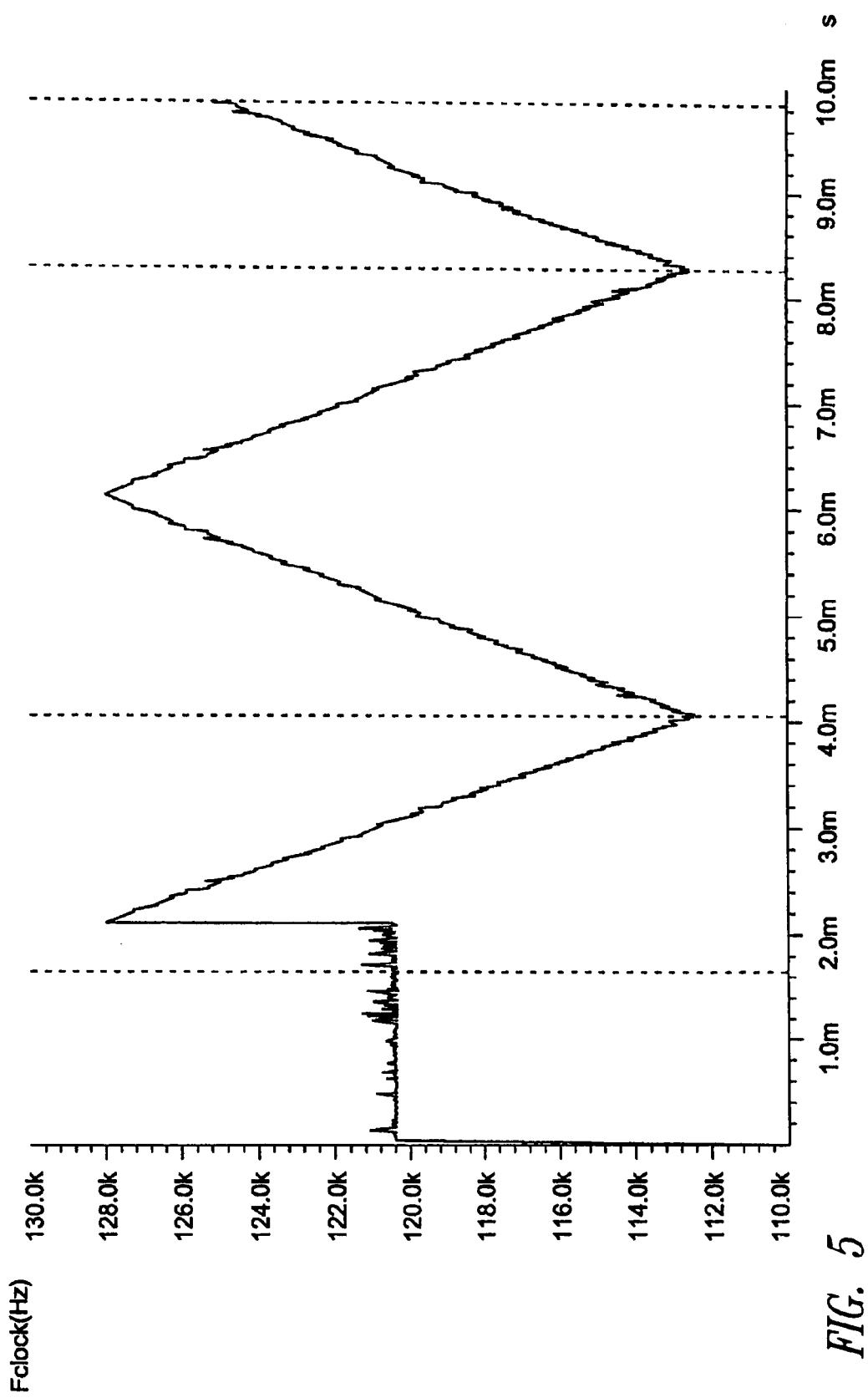
FIG. 5 shows the result of a simulation on the modulator in FIG. 2.

FIG. 5 shows the variation of the clock frequency Fclock resulting from the simulations on the circuit in FIG. 2 in the course of time.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A clock frequency modulator for an oscillator, comprising:
digital means for the generation of a signal for modulating said clock frequency, said digital means including means adapted to obtain from the signal generated by the oscillator a first pulse signal having a lower frequency than the clock frequency of the oscillator, a digital counter adapted to count the pulses of said first signal and to produce a digital signal and a digital-to-analog converter adapted to convert the digital signal in said signal for modulating the clock frequency of the oscillator.

2. The modulator of claim 1, wherein the means of the digital means are adapted to obtain from the signal generated by the oscillator a second signal having a lower frequency than the frequency of the first signal, said second signal gaining at least two logical levels and said digital counter adapted to increasingly or decreasingly count the pulses of said first signal depending on the logical level of the second signal.

3. The modulator of claim 2, comprising a first and a second frequency divider of the clock signal, said first divider adapted to divide the clock signal frequency by a first amount and said second divider adapted to divide the clock signal frequency by a second amount greater than the first amount, said first and second dividers adapted to respectively generate the first and the second signal, said digital counter supplied by said first and second signals.

4. The modulator of claim 2, wherein said digital to analog converter has at least one input reference voltage and said digital signal, said digital to analog converter adapted to generate said modulating signal with a triangular waveform including increasingly and decreasingly stepped ramps, each having the value of said reference signal.

5. The modulator of claim 3, wherein said digital to analog converter has a first input reference voltage adapted to establish the minimum level of the modulating signal and a second reference voltage adapted to establish the maximum level of the modulating signal, said digital to analog converter adapted to generate said modulating signal with a triangular waveform including increasingly and decreasingly stepped ramps, each having the value obtained from the difference between said second and said first reference voltages divided by a quantization value Q decreased by one unit, said value Q obtained from the following equation $$\frac{Nb}{Nf} = 2(Q-1)$$

where Nb indicates said second amount and Nf indicates said first amount.

6. A modulation method for a clock frequency of an oscillator, comprising:
generating a signal for modulating said clock frequency, said generation step including the step of obtaining a first pulse signal having a lower frequency than the clock frequency of the oscillator from the signal generated by the oscillator, digital counting of the pulses of said first signal, producing of a digital signal and the digital to analog conversion of the digital signal in said signal for modulating the clock frequency of the oscillator.

7. The method of claim 6, wherein said step of obtaining a first pulse signal from the signal generated by the oscillator includes the derivation from the signal generated by the oscillator of a second signal with a lower frequency than the frequency of the first signal, said second signal gaining at least two logical levels, said digital count increasingly or decreasingly occurring by means of the count of the pulses of said first signal depending on the logical level of the second signal.

8. The method of claim 7, wherein the digital-to-analog conversion of the digital signal in said signal modulating the clock frequency of the oscillator includes the generation of said triangular waveform modulating signal having increasingly and decreasingly stepped ramps, each having the value of a reference signal.

9. The method of claim 6, comprising the division of the frequency of the clock signal by a first amount and by a second amount greater than the first amount for the generation of said first and second signals.

10. The method of claim 9, wherein the digital to analog conversion of the digital signal in said signal modulating the clock frequency of the oscillator includes the generation of said triangular waveform modulating signal having increasingly and decreasingly stepped ramps, each having the value obtained by the difference between a first reference voltage adapted to establish the minimum level of the modulating signal and a second reference voltage adapted to establish the maximum level of the modulating signal divided by a quantization value Q decreased by one unit, said value Q resulting from the following equation $$\frac{Nb}{Nf} = 2(Q-1)$$

where Nb indicates said second amount and Nf indicates said first amount.

11. A modulator circuit for an oscillator, comprising:
a waveform generator comprising first and second frequency dividers adapted to receive a clock signal from the oscillator and divide the clock signal by predetermined values that are different one from the other;
a counter receiving output signals from the first and second frequency dividers and generating an output; and
a digital-to-analog converter receiving as input the output signal from the counter and further receiving at least one input reference voltage signal and generating in response thereto a triangular waveform signal for output to the oscillator.

12. The modulator circuit of claim 11, wherein the first frequency divider generates a high frequency signal and the second frequency divider generates a low frequency signal having a frequency that is lower than the high frequency signal, the low frequency signal having at least two logic levels adapted to control the counter so that the counter increasingly or decreasingly counts while the high frequency signal is a pulse signal having pulses that are counted by the counter.

13. The modulator of claim 11, wherein the digital-to-analog converter operates in response to the at least one input reference voltage signal so that each increase or decrease of the output of the counter results in an increase or decrease of a voltage value of the triangular waveform signal such that the triangular waveform signal includes voltage stepped ramps, each voltage-stepped ramp having a voltage value that is the input reference voltage signal value.

14. The modulator of claim 11, wherein the digital-to-analog converter receives two input reference signals that are adapted to respectively establish a minimum level and a maximum level of the triangular waveform signal output by the digital-to-analog converter wherein a voltage value of a single step of the triangular waveform signal is obtained from a division of a difference between the two input reference signals and a value Q that represents a number of quantization levels where $$\frac{Tb}{2} = (Q-1) \times Tf$$

in which: Tb=Nb/Fclock and Tf=Nf/Fclock, where Fclock indicates the frequency of the clock signal generated by the oscillator and Nb and Nf are the ratios of the frequency dividers such that $$\frac{Nb}{Nf} = 2(Q-1)$$

is therefore obtained.

15. A system, comprising:
an oscillator generating an output signal in the form of a clock signal; and
a modulator, the modulator comprising:
a waveform generator comprising first and second frequency dividers adapted to receive a clock signal from the oscillator and divide the clock signal by predetermined values that are different one from the other;
a counter receiving output signals from the first and second frequency dividers and generating an output; and
a digital-to-analog converter receiving as input the output signal from the counter and further receiving at least one input reference voltage signal and generating in response thereto a triangular waveform signal for output to the oscillator.

16. The system of claim 15, wherein the first frequency divider generates a high frequency signal and the second frequency divider generates a low frequency signal having a frequency that is lower than the high frequency signal, the low frequency signal having at least two logic levels adapted to control the counter so that the counter increasingly or decreasingly counts while the high frequency signal is a pulse signal, the pulses of which are counted by the counter.

17. The system of claim 15, wherein the digital-to-analog converter operates in response to the at least one input reference voltage signal so that each increase or decrease of the output of the counter results in an increase or decrease of a voltage value of the triangular waveform signal such that the triangular waveform signal includes voltage stepped ramps, each voltage stepped ramp having a voltage value that is the input reference voltage signal value.

18. The system of claim 15, wherein the digital-to-analog converter receives two input reference signals that are adapted to respectively establish a minimum level and a maximum level of the triangular waveform signal output by the digital-to-analog converter wherein a voltage value of a single step of the triangular waveform signal is obtained from a division of a difference between the two input reference signals and a value Q that represents a number of quantization levels where $$\frac{Tb}{2} = (Q-1) \times Tf$$

in which: $Tb = Nb/Fclock$ and $Tf = Nf/Fclock$, where Fclock indicates the frequency of the clock signal generated by the oscillator and Nb and Nf are the ratios of the frequency dividers such that $$\frac{Nb}{Nf} = 2(Q-1)$$

is therefore obtained.

* * * * *